(12) United States Patent
Bernds et al.

(10) Patent No.: US 6,903,958 B2
(45) Date of Patent: Jun. 7, 2005

(54) METHOD OF WRITING TO AN ORGANIC MEMORY

(75) Inventors: Adolf Bernds, Baiersdorf (DE); Wolfgang Clemens, Puschendorf (DE); Walter Fix, Furth (DE); Markus Lorenz, Nuremberg (DE); Henning Rost, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 59 days.

(21) Appl. No.: 10/380,206
(22) PCT Filed: Sep. 5, 2001
(86) PCT No.: PCT/DE01/03400
§ 371 (c)(1),
(2), (4) Date: Mar. 13, 2003
(87) PCT Pub. No.: WO02/23553
PCT Pub. Date: Mar. 21, 2002

(65) Prior Publication Data
US 2004/0026690 A1 Feb. 12, 2004

(30) Foreign Application Priority Data
Sep. 13, 2000 (DE) .......................... 100 45 192

(51) Int. Cl.$^7$ ............................................. G11C 17/00
(52) U.S. Cl. ........................ 365/96; 365/151; 365/105
(58) Field of Search ........................ 365/96, 105, 115, 365/151; 257/40

(56) References Cited

U.S. PATENT DOCUMENTS

| | | | |
|---|---|---|---|
| 4,340,657 A | 7/1982 | Rowe | |
| 4,937,119 A | 6/1990 | Nickles et al. | |
| 5,206,525 A | 4/1993 | Yamamoto et al. | |
| 5,321,240 A | 6/1994 | Takahira | |
| 5,347,144 A | 9/1994 | Garnier et al. | |
| 5,364,735 A | 11/1994 | Akamatsu et al. | |
| 5,486,851 A | 1/1996 | Gehner et al. | |
| 5,574,291 A | 11/1996 | Dodabalapur et al. | |

(Continued)

FOREIGN PATENT DOCUMENTS

| | | |
|---|---|---|
| DE | 4243832 | 6/1994 |
| DE | 198 16 860 | 11/1999 |
| DE | 198 51703 | 5/2000 |
| DE | 19933757 | 1/2001 |
| DE | 199 35 527 | 2/2001 |
| DE | 199 37 262 | 3/2001 |
| DE | 100 12204 | 9/2001 |
| DE | 100 43204 | 4/2002 |

(Continued)

OTHER PUBLICATIONS

Garnier F et al:, "Vertical Devices Architecture By Molding Of Organic–Based Thin Film Transistor", Applied Physics Letters, American Institute Of Physics. XP000784120, issn: 0003–6951 abbildung 2.

Collet J. et al:, Low Voltage, 30 NM Channel Length, Organic Transistors with a Self–Assembled Monolayer as Gate Insulating Films:, Applied Physics Letters, American Institute of Physics. New York, US, Bd 76, Nr. 14, Apr. 3, 2000, Seiten 1941–1943, XP000950589, ISSN:0003–6951, das ganze Dokument.

(Continued)

Primary Examiner—Gene N. Auduong
(74) Attorney, Agent, or Firm—Carella, Byrne et al.; Elliot Olstein; William Squire

(57) ABSTRACT

The invention relates to a memory, based on organic material and applied in combination with an organic integrated circuit (integrated plastic circuit). The invention particularly relates to a memory for a RFID-Tag (RFID-tags: radio frequency identification tags) and several methods for describing a memory.

20 Claims, 2 Drawing Sheets

U.S. PATENT DOCUMENTS

| | | | |
|---|---|---|---|
| 5,625,199 | A | 4/1997 | Baumbach et al. |
| 5,691,089 | A | 11/1997 | Smayling |
| 5,705,826 | A | 1/1998 | Aratani et al. |
| 5,854,139 | A | 12/1998 | Kondo et al. |
| 5,883,397 | A * | 3/1999 | Isoda et al. .................. 257/40 |
| 5,970,318 | A | 10/1999 | Choi et al. |
| 5,973,598 | A | 10/1999 | Belgel |
| 5,998,805 | A * | 12/1999 | Shi et al. ...................... 257/40 |
| 6,045,977 | A | 4/2000 | Chandross et al. |
| 6,072,716 | A | 6/2000 | Jacobsen et al. |
| 6,087,196 | A | 7/2000 | Sturm et al. |
| 6,133,835 | A | 10/2000 | De Leeuw et al. |
| 6,150,668 | A | 11/2000 | Bao et al. |
| 6,197,663 | B1 | 3/2001 | Chandross et al. |
| 6,207,472 | B1 | 3/2001 | Calligari et al. |
| 6,221,553 | B1 | 4/2001 | Wolk et al. |
| 6,321,571 | B1 | 11/2001 | Themont et al. |
| 6,329,226 | B1 | 12/2001 | Jones et al. |
| 6,330,464 | B1 | 12/2001 | Colvin et al. |
| 6,362,509 | B1 | 3/2002 | Hart |
| 6,384,804 | B1 * | 5/2002 | Dodabalapur et al. ........ 345/82 |
| 6,498,114 | B1 | 12/2002 | Amundson et al. |
| 6,555,840 | B1 | 4/2003 | Hudson et al. |
| 6,593,690 | B1 | 7/2003 | McCormick et al. |
| 6,603,139 | B1 | 8/2003 | Tessler et al. |
| 6,621,098 | B1 | 9/2003 | Jackson et al. |
| 2002/0053320 | A1 | 5/2002 | Duthaler |
| 2004/0084670 | A1 * | 5/2004 | Tripsas et al. ................ 257/40 |

FOREIGN PATENT DOCUMENTS

| | | |
|---|---|---|
| EP | 0 108 650 | 5/1984 |
| EP | 0 108650 | 5/1984 |
| EP | 0 418 504 | 3/1991 |
| EP | 0 418504 | 3/1991 |
| EP | 0 442123 | 8/1991 |
| EP | 0460242 | 12/1991 |
| EP | 0 511807 | 11/1992 |
| EP | 0 528662 | 2/1993 |
| EP | 0685985 | 12/1995 |
| EP | 0716458 | 6/1996 |
| EP | 0 786820 | 7/1997 |
| EP | 0962984 | 12/1999 |
| EP | 0 979715 | 2/2000 |
| EP | 0981165 | 2/2000 |
| EP | 1 048 912 | 11/2000 |
| EP | 1 103916 | 5/2001 |
| FR | 2793089 | 11/2000 |
| JP | 05152560 | 6/1993 |
| JP | 05259434 | 10/1993 |
| WO | WO 93 16491 | 8/1993 |
| WO | WO 94/17556 | 8/1994 |
| WO | WO 97/18944 | 5/1997 |
| WO | WO 98/40930 | 9/1998 |
| WO | WO 99/07189 | 2/1999 |
| WO | WO 99/10929 | 3/1999 |
| WO | WO 99 10939 | 3/1999 |
| WO | WO 99 21233 | 4/1999 |
| WO | WO 99 30432 | 6/1999 |
| WO | WO 99 39373 | 8/1999 |
| WO | WO 99 40631 | 8/1999 |
| WO | WO 99 54936 | 10/1999 |
| WO | WO 00/36666 | 6/2000 |
| WO | WO 01 15233 | 3/2001 |
| WO | WO 01/27998 | 4/2001 |
| WO | WO 01 47045 | 6/2001 |
| WO | WO 02 19443 | 3/2002 |
| WO | WO 02/47183 | 6/2002 |
| WO | WO 02/065557 | 8/2002 |
| WO | WO 00 79617 | 12/2004 |

OTHER PUBLICATIONS

Hwang J D et al:, "A Vertical Submicron Slc thin film transistor", Solid State Electronics, Elsevier Science Publishers, Barking, GB, Bd. 38, NR. 2, Feb. 1, 1995, Seiten 275–278, XP004014040, ISSN:0038–1101, Abbildung 2.

Rogers J A et al:, "Low–Voltage 0.1 Mum Organic Transistors and Complementary Inverter Circuits Fabricated with a Low–Cost Form of Near–Field Photolithography", Applied Physics Letters, American Institute of Physics, New York, US, Bd. 75, Nr. 7, Aug. 16, 1999, Seiten 1010–1012, XP000934355, ISSN:003–6951, das ganze Dokument.

"Short–Channel Field–Effect Transistor", IBM Technical Disclosure Bulletin, IBM Corp., New York, US, Bd. 32, Nr. 3A, Aug. 1, 1989, Seiten 77–78, XP000049357, ISSN:0018–8689, das ganze Dokument.

Redecker, M. et al., "Mobility enhancement through homogeneous nematic alignment of a liquid–crystalline polyfluorene", 1999 American Institute of Physics, Applied Physics Letters, vol. 74, No. 10, pp. 1400–1402.

Rogers, J. A. et al:, "Printing Process Suitable for Reel–to–Reel Production of High–Performance Organic Transistors and Circuits", Advanced Materials, VCH, Verlagsgesellschaft, Weinheim, DE, Bd. 11, Nr. 9, Jul. 5, 1999, Seiten 741–745, P000851834, ISSN: 0935–9648, das ganze Dokument.

Miyamoto, Shoichi et al:, Effect of LDD Structure and Channel Poly–Si Thinning on a Gate–All–Around TFT (GAT) for SRAM's, IEEE Transactions on Electron Devices. vol. 46, No. 8, Aug. 1999.

Kumar, Anish et al:, "Kink–Free Polycrystalline Silicon Double–Gate Elevated–Channel Thin–Film Transistors", IEEE Transactions on Electron Devices, vol. 45, No. 12, Dec. 1998.

Chen, Shiao–Shien et al:, "Deep Submicrometer Double–Gate Fully–Depleted SOI PMOS Devices: A Concise Short–Channel Effect Threshold Voltage Model Using a Quasi–2D Approadh", IEEE Transaction on Electron Devices, vol. 43, No. 9, Sep. 1996.

Zangara L: "Metall Statt Halbleiter, Programmierung Von Embedded ROMS Ueber Die Metallisierungen", Elektronik, Franzis Verlag GMBH, Munchen, DE, Bd. 47, Nr. 16, Aug. 4, 1998, Seiten 52–55, XP000847917, ISSN: 0013–5658, Seite 52, rechtes Plate, Zeile 7–Seite 53, linke Spalte, Zeile 14; Abbildungen 1, 2.

Hergel, H. J.: "Pld–Programmiertechnologien", Elektronik, Franzis Verlag GMBH. Munchen, DE, Bd 41, Nr. 5, Mar. 3, 1992, Seiten 44–46, XP000293121, ISSN: 0013–5658, Abbildungen 1–3.

Forrest et al.: "The Dawn of Organic Electronics", IEEE Spectrum, Aug. 2000, Seiten 29–34, XP002189000, IEEE Inc., New York, US ISSN:0018–9235, Seite 33, rechte Spalte, Zelle 58–Seite 34, linke Spalte, Zeile 24; Abbildung 5.

Patent Abstracts of Japan, vol. 009, No. 274 (E–354), Oct. 31, 1985 & JP 60 117769 A (Fujitsu KK), Jun. 25, 1985 Zusammenfassung.

Zie Voor Titel Boek, de 2e Pagina, XP–002189001, PG 196–228.

Drury et al., "Low–Cost All–Polymer Integrated Circuits", American Institute of Physics, Applied Physics Letters, 1998, vol. 73, No. 1, pp 108–110, Jul. 6, 1998.

Kuhlmann et al., "Terabytes in Plastikfolie", Organische Massenspeicher vor der Serienproduktion.

Garnier, F. et al, "All–Polymer Field–Effect Transistor Realized by Printing Techniques", Science, American Association for the Advancement of Science, US, vol. 265, Sep. 16, 1994, pp 1684–1686.

Assadi A, et al:, Field–Effect Mobility of Poly (3–Hexylthiophene) Dept. of Physics and Measurement Technology, accepted for Publication May 17, 1988.

Bao, Z. et al., "High–Performance Plastic Transistors Fabricated by Printing Techniques", Chem. Mater vol. 9, No. 6, 1997, pp 1299–1301.

Drury, C. J. et al., "Low–cost all–polymer integrated circuits", Applied Physics Letters, vol. 73, No. 1, Jul. 6, 1988, pp 108–110.

Angelopoulos M et al, "In–Situ Radiation Induced Doping", Mol. Cryst. Liq. Cryst. 1990, vol. 189, pp. 221–225.

Dai, L. et al, Photochemical Generation of Conducting Pattersn in Polybutadiene Films:, Macromolecules, vol. 29, No. 1, 1996, pp. 282–287, XP 001042019, the whole document.

Roman et al., Polymer Diodes with High Rectification:, Applied Physics Letters, vol. 75, No. 21, Nov. 22, 1999.

Patent Abstracts of Japan, vol. 010, No. 137, May 21, 1986 (JP 361001060A).

Schoebel, "Frequency Conversion with Organic–On–Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982–1984.

Yu, G. et al., "Dual–function semiconducting polymer devices: Light–emitting and photodetecting diodes", American Institute of Physics, Applied Physics Letter 64, Mar. 21, 1994, pp. 1540–1542.

Lucent Technologies, "Innovation marks significant milestone in the development of electronic paper", Cambridge, MA and Murray Hill, NJ, Nov. 20, 2000. XP–002209726.

Hebner, T.R. et al., Ink–jet printing of doped polymers for organic light emitting devices:, American Institute of Physics, Applied Physics Letters, vol. 72, No. 5, Feb. 2, 1998, pp. 519–521.

Garnier et al., "Conjugated Polymers and Oligomers as Active Material For Electronic Devices", Synthetic Metals, vol. 28, 1989.

Gelinck, G.H. et al., "High–Performance All–Polymer Integrated Circuits", Applied Physics Letters, v. 77, 2000, pp. 1487–1489.

Zheng, Xiang–Yang et al., "Electrochemical Patterning of the Surface of Insulators with Electrically Conductive Polymers", J. Electrochem. Soc., v. 142, 1995, pp L226–L227.

Lidzey, D. G. et al., "Photoprocessed and Micropatterned Conjugated Polymer LEDs", Synthetic Metals, V. 82, 1996, pp. 141–148.

Kobel W. et al., "Generation of Micropatterns in Poly (3–Methyl–Thiophene) Films Using Microlithography: A First Step in the Design of an All–Organic Thin–Film Transistor" Synthetic Metals, V. 22, 1988, pp. 265–271.

Rost, Henning et al., "All–Polymer Organic Field Effect Transistors", Proc. Mat. Week, CD, 2001, pp. 1–6.

Manuelli, Alessandro et al., "Applicability of Coating Techniques for the Production of Organic Field Effect Transistors", IEEE Polytronic 2002 Conference, 2002, pp. 201–204.

Ullman, A. et al., "High Performance Organic Field–Effect Transistors and Integrated Inverters", Mat. Res. Soc. Symp. Proc., v. 665, 2001, pp. 265–270.

Fix, W. et al., "Fast Polymer Integrated Circuits Based on a Polyfluorene Derivative", ESSDERC 2002, 2002, pp. 527–529.

Knobloch, A. et al., "Printed Polymer Transistors", Proc. Polytronic, v. 84, 2001, pp. 84–89.

Ficker, J. et al., "Dynamic and Lifetime Measurements of Polymer OFETS and Integrated Plastic Circuits," Proc. of SPIE, v. 466, 2001, pp. 95–102.

Clemens, W. et al., "Vorn Organischen Transistor Zurn Plastik–Chip," Physik Journal, V. 2, 2003, pp. 31–36.

Crone, B. et al, "Large–scale complementary Integrated circuits based on Organic transistors", Nature, vol. 403, Feb. 3, 2000, pp. 521.

Fix, W., et al., "Fast polymer integrated circuits", American Institute of Physics, Applied Physics Letters, vol. 81, No. 89, Aug. 2002, pp. 1735–1737.

Dodabalapur, A. et al., Organic smart pixels, American Institute of Physics, Applied Physics Letters, vol. 73, No. 2, Jul. 13, 1998, pp. 142–144.

Halls, J.J. M., et al., "Efficient photodiodes from interpenetrating polymer networks", Nature, vol. 376, Aug. 10, 1995, pp. 498–500.

Brown, A.R. et al., "Field–effect transistors made from solution–processed organic semiconductors", Elsevier Science, S.A., Synthetic Metals 88 (1997) pp. 37–55.

Brown, A.R., "Logic Gates Made from Polymer Transistors and Their Use in Ring Oscillators", Science, vol. 270, Nov. 10, 1995, pp 972–974.

Klauk, H. et al., "Pentacene Thin Film Transistors and Inverter Circuits", 1997 International Exectron Devices Meeting Technical Digest, pp. 539–542, Dec. 1997.

Klauk, H. et al., "Fast Organic Thin Film Transistor Circuits", IEEE Electron Device Letters, vol. 20, No. 6, pp. 289–291.

Bao, Z. et al., "Organic and Polymeric Materials for the Fabrications of Thin Film Field–Effect Transistors", paper presented at the meeting of American Chemical Society, Division of Polymer Chemistry, XX, XX, Bd. 39, Nr. 1, Mar. 29, 1998, P001032497, ISSN: 0032–3934 das ganze Dokument.

Patent Abstracts of Japan, vol. 013, No. 444 (E–828), Oct. 5, 1989 & JP 01 169942 A (Hitachi Ltd), Jul. 5, 1989.

Zangara L:, "Metall Statt Halbleiter. Programmierung Von Embedded Roms Ueber Die Metallisierungen" Elektronik, Franzis Verlag GMBH. Munchen, DE, Bd. 47, Nr. 16, Aug. 4, 1998, Seiten 52–55, XP000847917, ISSN: 0013–5658, Seite 52, rechte Spalte, Zeile 7–Seite 53, linke Spalte, Zeile 14; Abbildungen 1, 2.

Hergel HJ:, "PLD–Programmiertechnologien" Elektronik, Franzis Verlag GMBH. Munchen, DE, Bd. 41, Nr. 5, Mar. 3, 1992 91992–03–03), Seiten 44–46, XP000293121, ISSN: 0013–5658, Abbildungen 1–3.

Patent Abstracts of Japan, vol. 013, No. 444 (E–828), Oct. 5, 1989 & JP 01 169942 A (Hitachi Ltd), Jul. 5, 1989 Zusammenfassung.

Forrest et al.:, "The dawn of organic electronics", IEEE Spectrum., Aug. 2000, Seiten 29–34, XP002189000, IEEE Inc. New York., US ISSN: 0018–9235, Seite 33, rechte Spalte, Zeile 58–Seite 34, linke Spalte, Zeile 24; Abbildung 5.

Carr et al:, "MOS/LSI Design and Applications.", 1972, Mc–Graw Hill, New York, US, XPL002189001 76730, Seite 196, Zeile 33–Seite 197, Zeile 6; Abbildung 7.1.

Zie Voor Titel Boek, de 2e Pagina, XP–002189001, p. 196–228.

Low–cost all–polymer integrated circuits, Drury et al., vol. 73, No. 1,Jul. 6, 1998.

* cited by examiner

METHOD OF WRITING TO AN ORGANIC MEMORY

CROSS REFERENCE TO RELATED APPLICATIONS

This is the 35 U.S.C. 371 National Stage of International Application PCT/DE01/03400 filed on Sep. 5, 2001, which designated the United States of America.

FIELD OF THE INVENTION

The invention relates to a memory, based on organic material and applied in combination with an organic integrated circuit (integrated plastic circuit). The invention particularly relates to a memory for an RFID tag (RFID tags: radio frequency identification tags) and a plurality of methods for writing to a memory.

BACKGROUND OF THE INVENTION

Organic integrated circuits based on organic field effect transistors (OFETs) are used for high-volume microelectronics applications and disposable products such as contactless readable identification and product tags, where the excellent operating characteristics of silicon technology can be sacrificed in favor of guaranteeing mechanical flexibility and very low manufacturing costs. The components such as electronic barcodes are typically disposable products.

For these organic integrated circuits, such as are known for example from WO 99/30432, there has hitherto been no solution to the problem as to how information can be stored in an identification tag and/or a low-cost IPC.

The solutions offered by semiconductor technology are over-qualified and above all too costly for the requirements of these mass-produced articles.

SUMMARY OF THE INVENTION

The object of the invention is therefore to create an organic memory for microelectronic mass-production applications and disposable products, which is based on organic material.

The invention relates to a memory which is based on organic materials. In addition, the invention relates to an identification tag (RFID tag) which is based on organic materials and which uses organic field effect transistors and an organic memory. The invention also relates to the use of an organic memory. Finally, the invention relates to a method for writing to an organic memory, in which with regard to an integrated circuit based on organic material either there is no transistor circuit present, it has been made non-conducting through manipulation of one or more conductor tracks, and/or single conductor tracks are conducting or non-conducting.

In this context, the term "organic material" encompasses all types of organic, metal-organic and/or inorganic plastics. It covers all types of material except for the semiconductors used for conventional diodes (germanium, silicon) and the typical metallic conductors. It is therefore not intended to restrict the term "organic material" to carbon-containing material in any dogmatic sense, rather having in mind also the widespread use of e.g. silicones. Furthermore, the term should not be subject to any restriction with regard to the molecule size, in particular with regard to polymeric and/or oligomeric materials, but the use of "small molecules" should certainly also be possible.

By preference, the organic memory is of the write-once type.

According to one embodiment, the organic memory consists of a transistor circuit which is comparable from the circuitry principle employed with the read-only storages known from semiconductor technology.

Writing to a memory of this type can be performed by way of mask programming in which the transistors or their gates are not present at the corresponding locations and/or the gate oxide of the transistors has different thicknesses (transistor conducting/non-conducting).

The write process can also be implemented by way of so-called "fusable links", in other words by way of conductor tracks which can be interrupted by means of a current. "Fusable links" can be thin conductor tracks consisting of a conducting organic material such an Pani or Pedot or polypyrrole.

Furthermore, conducting and non-conducting conductor tracks can be provided within a transistor circuit, for example one conductor track can be present for each bit, whereby a closed conducting conductor track corresponds to a logical "0" and an open or non-conducting conductor track corresponds to a logical "1".

A particularly forgery-proof variant provides two conductor tracks for at least one data bit and preferably for each data bit. During the write process, one of these conductor tracks is made non-conducting. Depending on which conductor track is non-conducting, the bit is permanently written to 1 or 0. As a result of the use of two conductor tracks, subsequent modification is no longer possible.

A further possible means of writing to the memory having an organic basis consists in modifying the dielectric constant of the gate oxide. In this situation, the isolating layer between gate and semiconductor is changed (by the effect of light for example) such that a change in the dielectric constant results, which has the effect that the gate either conducts (high dielectric constant) or isolates (low dielectric constant).

In addition to the possibility of constructing a memory based on organic material with transistor circuitry, there is a variant using single conductor tracks that are either conducting or non-conducting for constructing memories whereby in order to retrieve the stored information their resistance is read out. In this situation, for example, the "conducting" state corresponds to a logical "0" and the "non-conducting" state corresponds to a logical "1". The read-out process can be carried out with the aid of transistors, for example.

By preference, the memories are of the write-once type, with the write process preferably but not exclusively being effected through manipulation of one or more conductor tracks. In this situation, the following processes can be used for writing to the memory:

A conductor track can be destroyed by means of laser light or specifically applied heat, and thus rendered non-conducting.

Chemical treatment such as base/acid stamp, for example (making conducting areas non-conducting or vice versa)

Mechanical processing, for example separating a conductor track by using a needle An electrical voltage is used to locally short-circuit a conductor track and thereby destroy it by overheating.

The conductor track can be separated or closed on a mask/plate simply by omitting a structure during the production process.

The dielectric constant can be changed by means of laser light.

By using the aforementioned process steps the memory can be written to only on a single occasion. The write operation can take place during manufacture of the tag or of the product (anti-counterfeiting mechanism or electronic bar code for example, whereby a large number of tags have the same memory contents) or during assembly of the electronics (luggage label, electronic stamp, electronic ticket, whereby each ticket has different memory contents).

Since the organic materials can only rarely be differentiated from one another by analytical methods, corresponding codings are also forgery-proof to a large extent.

At the same time, this technology can also be used in order to selectively render unusable an electronic device, such as an electronic bar code or an electronic ticket for example, after it has been used by specifically impressing a particular bit arrangement or rendering the memory unreadable after use (when the ticket is cancelled, when payment is made at the till).

The memory can be used in combination with the following systems:

In an integrated plastic circuit, in other words in a circuit which is based on organic material
In an identification system (identification tags, RFID (radio frequency ident tags)), for example for
  electronic bar code
  electronic tickets
  anti-counterfeiting mechanism
  product information
In a sensor
In an organic display with integrated electronics

BRIEF DESCRIPTION OF THE DRAWINGS

The invention will also be described in the following with reference to two drawings which show preferred embodiments of the invention. In the drawings.

DETAILED DESCRIPTION OF THE INVENTION

Figure 1:
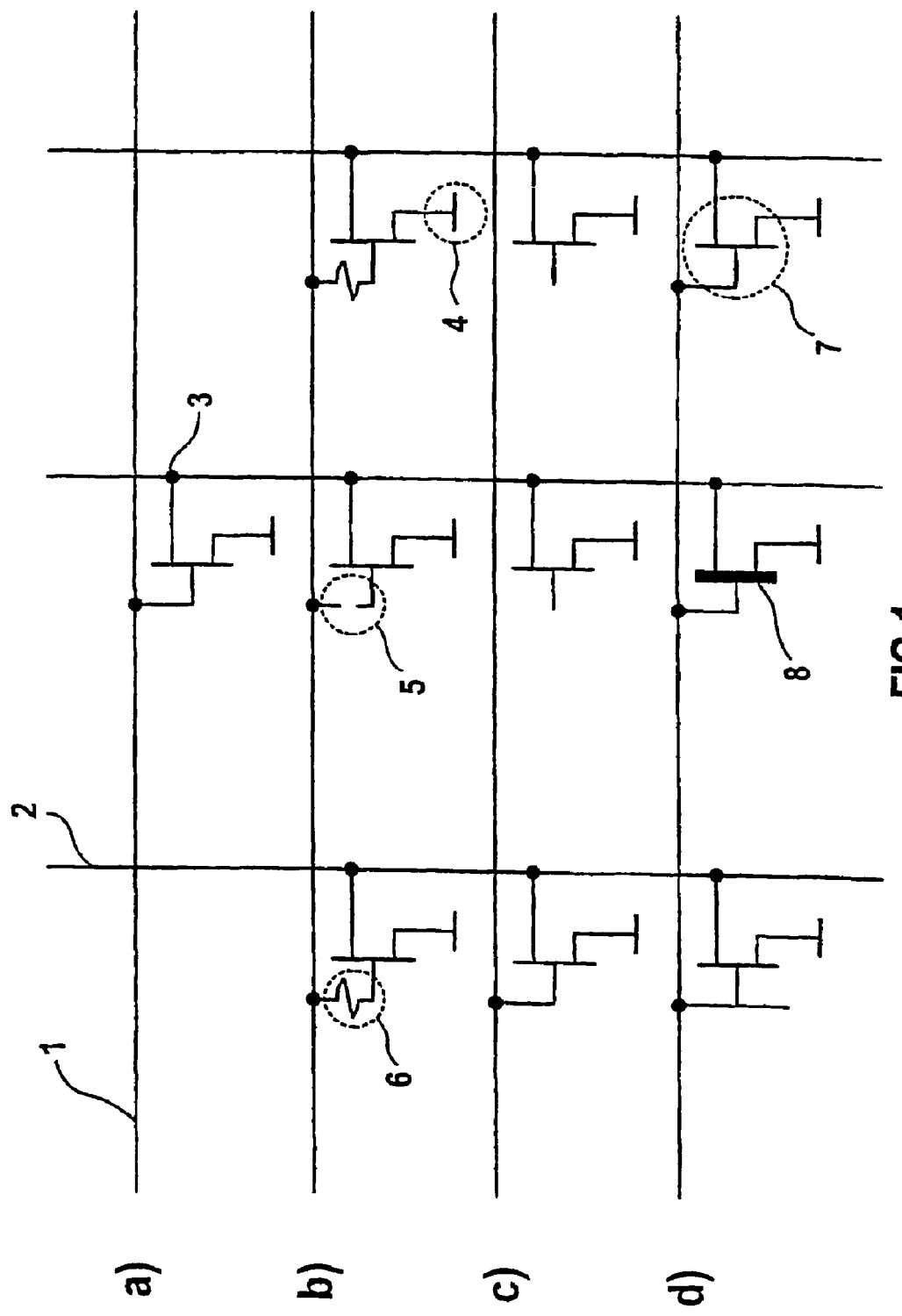
FIG. 1 shows a memory matrix in different embodiments.

FIG. 1 shows a schematic circuit diagram of four embodiments of a memory matrix.

The circuit a) shows the programming through omission of the corresponding transistors of an integrated circuit for example;
b) shows a so-called fusable link, whereby several conductor tracks are interrupted by a current surge and/or laser light or in some other manner (see there, middle field);
c) shows the mask programming, whereby conductor tracks are either connected or not, in other words the transistor is connected or not connected, and
d) shows the embodiment having different gate thicknesses which are conducting or non-conducting.

The horizontal lines 1 and the vertical lines 2 represent the electrical lines of the circuit. The points 3 serve to mark the fact that two crossing conductor tracks are in electrical contact with one another. The circuit symbol 7 represents a field effect transistor and shows the three terminals: source, drain and gate. The "T pieces" 4 represent the earth connection for the individual transistors in the circuit.

In section b) of the figure, two zigzag conductor tracks 6 can be recognized which represent thin conductor tracks and/or conductor tracks with a fuse which can be easily interrupted.

The interrupted conductor track 5 in the middle section in part b) of the figure shows that the electrical line has been interrupted at this location at a point 3 for example by means of short-circuiting or laser light.

In part d) of the circuit diagram, the middle transistor has a thicker gate oxide 8, as a result of which the current channel of the transistor becomes non-conducting.

Figure 2:
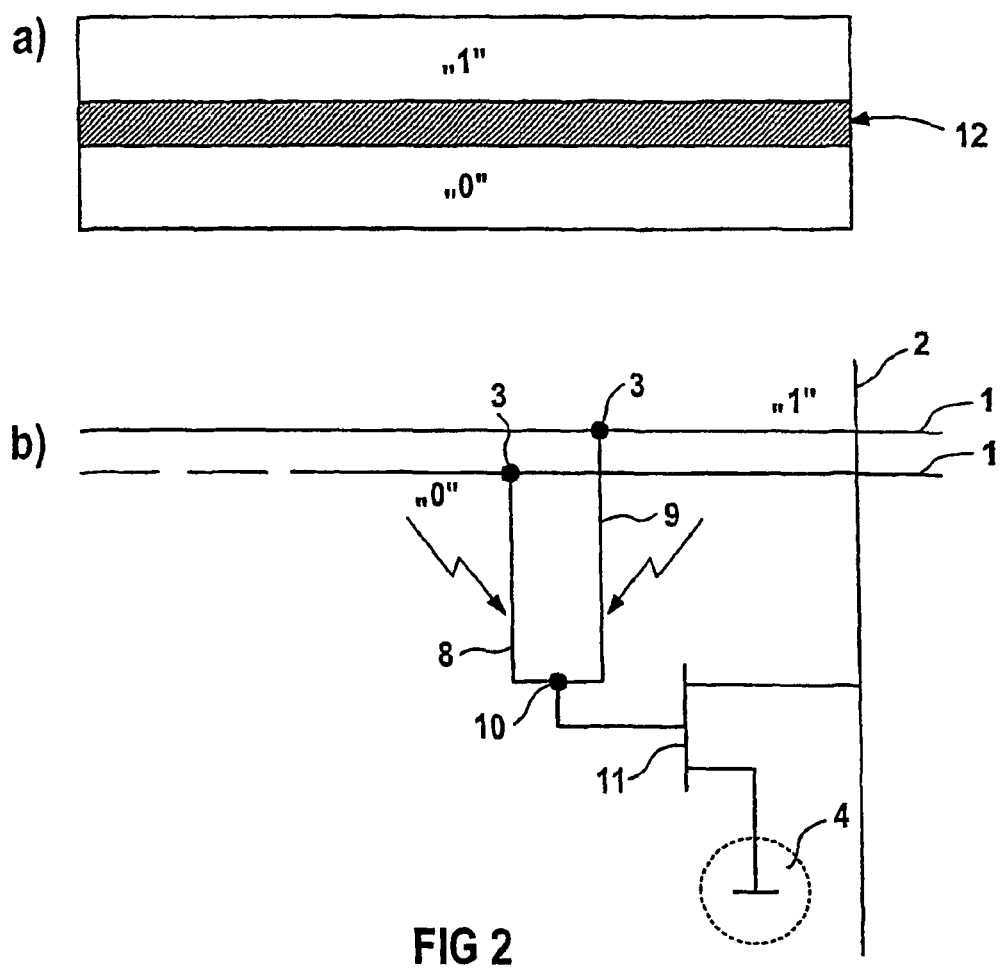
FIG. 2 shows an embodiment having a different thickness of gate oxide.

FIG. 2 shows a cross-sectional representation of a transistor with thick and thin gate oxide. On a carrier (not shown) is located the first semiconducting layer with source and drain electrodes 10,11 which are connected by way of a semiconducting layer 12. Above the semiconducting layer 12 is located the isolating layer 13a, 13b. Above this layer 13 is located the gate electrode 14. In case a) with the isolating layer 13a, the isolator is so thick that the gate voltage is not sufficient to make the current channel conducting and in case b) it is sufficiently narrow to make the current channel conducting. The result is accordingly a blocking transistor in case a) and a conducting transistor in case b).

A particularly forgery-proof variant of the organic memory is achieved with duplicated conductor track implementation. In this situation, the second conductor track contains the complementary information of the first, in other words if the first is conducting ("1" bit) then the second is non-conducting ("0" bit). Subsequent modification of the memory information is no longer possible.

Use of the invention makes it possible to store information in integrated circuits based on organic materials. This can be exploited cost-effectively in particular for use in RFID tags employed in anti-counterfeiting, as an electronic ticket, as a luggage label etc. No memories for so-called "plastic circuits" are known up until now.

What is claimed is:

1. Method for writing to an organic memory, comprising the steps of:
   providing at least one integrated circuit comprising a plurality of transistors each based on organic material wherein a transistor active element comprises mainly organic material; and
   selectively setting each said transistor to be one of conductive and non conductive;
   wherein said selective setting is accomplished by at least one of controlling the presence or absence of one or more selected transistors within the integrated circuits such that the one or more selected transistors are made nonconducting through manipulation of one or more conductor tracks, and single conductor tracks are arranged to be conducting or non-conducting.

2. Method according to claim 1, wherein the selective setting is performed by mask programming in which the selected transistors or gate of the selected transistors are not present at corresponding locations.

3. Method according to claim 2, wherein a change in a dielectric constant in the integrated circuit is implemented by laser light.

4. Method according to claim 2, wherein the write process is implemented by fusible links.

5. Method according to claim 2, wherein the transistors each include a conductor track, and a conductor track is destroyed by means of one of laser light and specifically applied heat, and thus rendered non-conducting.

6. Method according to claim 2, wherein the transistors each include a conductor track, and mechanical processing is used to manipulate a conductor track.

7. Method according to claim 1, wherein the selective setting is implemented using fusible links.

8. Method according to claim 7, wherein the transistors each include a conductor track, and a conductor track is destroyed by means of one of laser light and specifically applied heat, and thus rendered non-conducting.

9. Method according to claim 7, wherein the transistors each include a conductor track, and mechanical processing is used to manipulate a conductor track.

10. Method according to claim 1, wherein the transistors each include a conductor track, and the conductor track is destroyed by means of one of laser light and specifically applied heat, and thus rendered non-conducting.

11. Method according to claim 10, wherein the transistors each include a conductor track, and mechanical processing is used to manipulate a conductor track.

12. Method according to claim 1, wherein chemical treatment is used to change conductivity of selected areas of the one or more selected transistors.

13. The method of claim 12, wherein the chemical treatment comprises use of a base/acid stamp.

14. Method according to claim 12, wherein the transistors each include a conductor track, and mechanical processing is used to manipulate a conductor track.

15. Method according to claim 1, wherein the transistors each include a conductor track, and mechanical processing is used to manipulate a conductor track.

16. Method according to claim 1, wherein the transistors each include a conductor track, and an electrical voltage is used to locally short-circuit a conductor track.

17. Method according to claim 1, wherein the transistors each include a conductor track, and a conductor track is separated or closed on a mask by omitting a structure during the providing.

18. Method according to claim 1, wherein the method is used in order to impress a particular bit arrangement.

19. The method of claim 1, wherein each transistor has a gate oxide, selective setting being performed by mask programming to control conductivity of the selected one or more transistors by adjusting a dielectric constant of the gate oxide of each said selected transistor.

20. The method of claim 1, wherein the transistors each include a conductor track, and electrical voltage is used to destroy a conductor track through overheating.

* * * * *

UNITED STATES PATENT AND TRADEMARK OFFICE
CERTIFICATE OF CORRECTION

PATENT NO. : 6,903,958 B2  Page 1 of 1
APPLICATION NO. : 10/380206
DATED : June 7, 2005
INVENTOR(S) : Adolf Bernds et al.

It is certified that error appears in the above-identified patent and that said Letters Patent is hereby corrected as shown below:

Col. 4, line 45, change "circuits" to -- circuit --
    line 52, change "transistors" to -- transistor -- (two places)
    line 60, change "a" (second occurrence) to -- the --

Col. 6, line 14, before "selective" insert -- the --

Signed and Sealed this

Third Day of July, 2007

JON W. DUDAS
*Director of the United States Patent and Trademark Office*